United States Patent [19]
Mitarai et al.

[11] Patent Number: 5,878,068
[45] Date of Patent: Mar. 2, 1999

[54] ENERGY QUANTITY CONTROL METHOD

[75] Inventors: Reiji Mitarai, Hachiohji; Youzou Fukagawa, Tochigi-ken, both of Japan

[73] Assignee: Canon Kabushiki Kaisha, Tokyo, Japan

[21] Appl. No.: 796,677

[22] Filed: Feb. 6, 1997

[30]      Foreign Application Priority Data

Feb. 7, 1996  [JP]  Japan .................................. 8-021148

[51] Int. Cl.⁶ ........................... H01S 3/134; B23K 26/00
[52] U.S. Cl. ...................... 372/30; 219/121.61; 372/25; 372/29
[58] Field of Search ................................ 372/31, 30, 29, 372/25, 57; 219/121.61

[56]             References Cited

U.S. PATENT DOCUMENTS

5,128,950   7/1992  Tsuchiya et al. ..................... 372/25
5,418,806   5/1995  Araki ..................................... 372/30
5,710,787   1/1998  Amade et al. ......................... 372/57

Primary Examiner—James W. Davie
Attorney, Agent, or Firm—Fitzpatrick, Cella, Harper & Scinto

[57]               ABSTRACT

An energy quantity control method usable with a pulse energy producing source for successively emitting energy pulses of an energy quantity variable with time, wherein a control parameter for the pulse energy producing source is adjustable to control an energy quantity of an energy pulse, the method including determining, on the basis of a difference between a desired value for integrated energy quantity of energy pulses and an actually measured value for the integrated energy quantity, a desired value for a subsequent energy quantity to be provided subsequently by a subsequent energy pulse, and adjusting the control parameter on the basis of a difference between the desired value for the subsequent energy quantity to be provided subsequently by the subsequent energy pulse and an actually measured energy quantity provided by a last-emitted energy pulse.

10 Claims, 6 Drawing Sheets

ENERGY QUANTITY CONTROL METHOD

FIELD OF THE INVENTION AND RELATED ART

This invention relates to an energy quantity control method for a pulse energy producing source and, more particularly, to an energy quantity control method suitably applicable to exposure amount control in an exposure apparatus using an excimer laser as a light source, for example.

Figure 7:
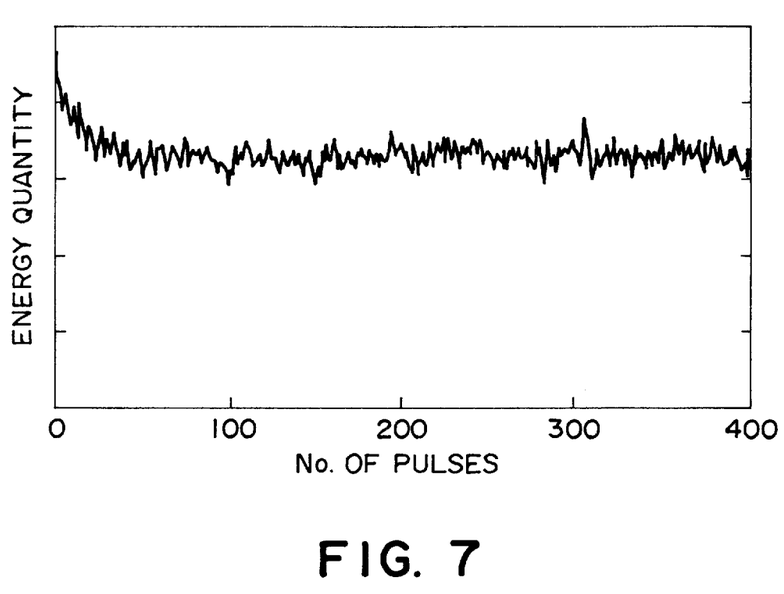
FIG. 7 is a graph for explaining variation with time of energy quantity, without control.

Excimer lasers are used as a light source of an exposure apparatus, for example, and they involve dispersion in energy quantity of emitted light pulses, of about ±10% in probability. Also, there is a problem of short-term or long-term reduction of energy quantity of emitted light pulses. The energy quantity reduction phenomenon attributes to degradation of mixed gases of active substances (such as KrF or ArF, for example) sealingly accommodated in a chamber. FIG. 7 shows short-term reduction of energy quantity in a case a KrF excimer laser is oscillated under a constant applied electric voltage. At rise time, there occurs an energy quantity variation of spike-like. Long-term energy quantity reduction phenomenon means is a phenomenon that the final rectified value in the wave form of FIG. 7 varies with light emissions. In FIG. 7, variation in high frequency of the energy quantity represents the dispersion in terms of probability as described above.

Generally, there is a predetermined relation, to be described, between an applied electric voltage to a pulse laser light source (or a charging electric voltage at the time of pulse light emission) and an energy quantity of a light pulse to be emitted with that applied voltage. Thus, the energy quantity to be emitted is determined definitely by determining the electric voltage to be applied. However, if a change occurs with time in that relation, such as degradation of mixed gases of active substances in a case of a gas laser as an excimer laser, for example, simply determining the electric voltage, to be applied, in accordance with the energy quantity to be emitted subsequently on the basis of the predetermined relation mentioned above, would not result in emission of a desired energy quantity. In consideration of this, there has been proposed an energy quantity control method in which, on the basis of measured values of applied electric voltage and measured values of energy quantity, the information related to the above-mentioned relation is renewed per a predetermined unit pulse number or a predetermined unit time period, to compensate short-term or long-term reduction of energy quantity of emitted pulse light.

The relation between an applied electric voltage and an energy quantity to be emitted with that applied electric voltage, can be represented by equation (1) below. Equation (1) is a static relation wherein variation with time is not taken into account. As regards information related to changes with time, which are obtainable from experiments, for example, those data as measured during actual operation of the apparatus are processed in accordance with equations (2) and (3), and coefficients a, b and c in equation (1) are renewed.

$$p = a + bv + cv^2 \qquad (1)$$

$$\begin{bmatrix} a \\ b \\ c \end{bmatrix} = B^{-1} \begin{bmatrix} \sum_{i=1}^{\infty} p_i \gamma_i^2 \\ \sum_{i=1}^{\infty} p_i v_i \gamma_i^2 \\ \sum_{i=1}^{\infty} p_i v_i^2 \gamma_i^2 \end{bmatrix} \qquad (2)$$

$$B = \begin{bmatrix} \sum_{i=1}^{\infty} \gamma_i^2 & \sum_{i=1}^{\infty} v_i \gamma_i^2 & \sum_{i=1}^{\infty} p_i v_i^2 \gamma_i^2 \\ \sum_{i=1}^{\infty} v_i \gamma_i^2 & \sum_{i=1}^{\infty} v_i^2 \gamma_i^2 & \sum_{i=1}^{\infty} v_i^3 \gamma_i^2 \\ \sum_{i=1}^{\infty} v_i^2 \gamma_i^2 & \sum_{i=1}^{\infty} v_i^3 \gamma_i^2 & \sum_{i=1}^{\infty} v_i^4 \gamma_i^2 \end{bmatrix} \qquad (3)$$

where p is the energy quantity, and v is the applied electric voltage. Subscript "i" represents the freshness of the data, a larger being an older. Character $\gamma$ represents what can be called an oblivion coefficient, and it is a positive real number smaller than 1.

SUMMARY OF THE INVENTION

With the above-described procedure, complicated calculations according to equations (2) and (3) are necessary to renew the information. If the information has to be renewed frequently in order to keep high control precision, a certain time is required for it. This may cause decrease of throughput when the system is used in an exposure apparatus.

It is accordingly an object of the present invention to provide an energy quantity control method by which a short-term spike-like variation characteristic or long-term deterioration characteristic of a pulse emission type energy producing source can be compensated with a feedback system and by which high-precision and reduced-time control of energy quantity is assured.

In accordance with an aspect of the present invention, there is provided an energy quantity control method usable with a pulse energy producing source for successively emitting energy pulses of an energy quantity variable with time, wherein a control parameter for the pulse energy producing source is adjustable to control an energy quantity of an energy pulse, said method comprising the steps of: determining, on the basis of a difference between a desired value for integrated energy quantity of energy pulses and an actually measured value for the integrated energy quantity, a desired value for a subsequent energy quantity to be provided subsequently by a subsequent energy pulse; and adjusting the control parameter on the basis of a difference between the desired value for the subsequent energy quantity to be provided subsequently by the subsequent energy pulse and an actually measured energy quantity provided by a last-emitted energy pulse.

In accordance with another aspect of the present invention, there is provided an energy quantity control system which is arranged to control an energy quantity of an energy pulse to be provided by an energy producing source, in accordance with a method such as recited above.

In accordance with a further aspect of the present invention, there is provided an exposure apparatus for transferring a pattern of a mask on to a wafer, with a control procedure according to a method such as recited above.

In accordance with a still further aspect of the present invention, there is provided a device manufacturing method which includes a procedure for manufacturing a device by use of an exposure apparatus such as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
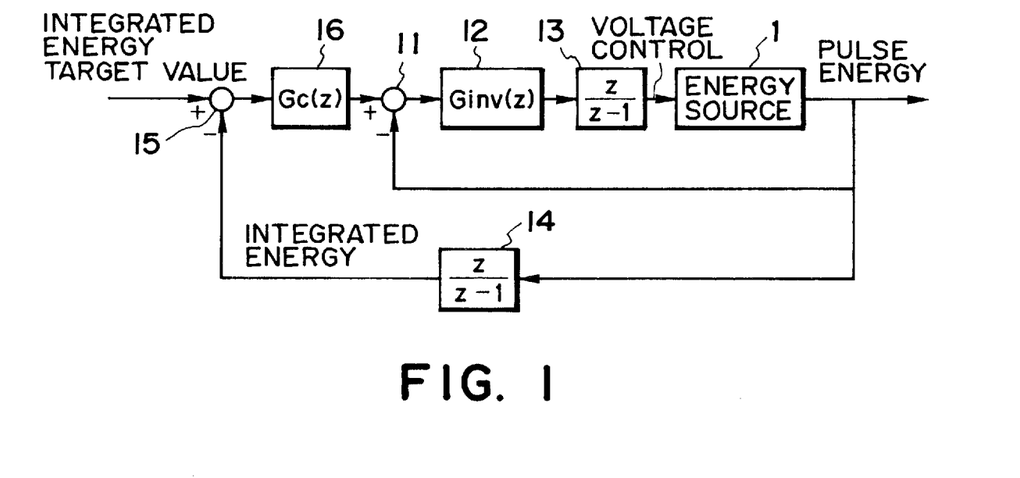
FIG. 1 is a block diagram for explaining a basic structure of a feedback system used in an energy quantity control method according to the present invention.

FIG. 1 is a block diagram of a feedback system according to the present invention, wherein an energy producing source 1 is an element to which an electric voltage (applied voltage) is applied as a control input and which produces a pulse energy as a controlled variable. It involves variation in output within a predetermined range, and it is the subject of control. As direct preposition to the energy producing source 1, there are two compensating means (whitening compensation means 12 and integration compensation means 13). These three elements combined in series are closed by an output feedback loop. This loop is located inside a dual loop, and it operates to control the energy quantity of each pulse toward a desired value.

On the other hand, an outside loop operates to adjust an integrated energy quantity toward a desired value, and it is arranged as follows. First, energy quantity integrating means 14 integrates measured pulse energies, and an integrated energy quantity from a predetermined time moment is detected. The integrated energy quantity is compared with a target value being set, by use of comparing means 15, and a deviation is detected. On the basis of this deviation, energy quantity determining means 16 determines a target value for energy quantity of one pulse to be emitted subsequently. This target value is a specified value to be applied to the inside loop.

As described above, the pulse energy producing source 1 involves a phenomenon of short-term variation in energy quantity which is particularly notable at rise time after stoppage. This can be called a dynamic characteristic of the pulse energy producing source 1, and it can be expressed by equation (4) in terms of discrete time series expression:

$$P_i = ap_{i-1} + bv_i - cv_{i-1} \qquad (4)$$

where p and v are energy quantity and applied electric voltage similar to those of equations (1)–(3). Subscript i denotes a discrete time, where a smaller represents an older. Characters a, b and c are fixed coefficients which are predetermined on the basis of the characteristic of the pulse energy producing source 1. To the dynamic characteristic as expressed by equation (4), a fresh operating variable w is prepared to perform compensation calculation of equation (5):

$$v_i = (c/b)v_{i-1} + (1/b)w_i - (a/b)w_{i-1} \qquad (5)$$

Figure 2:
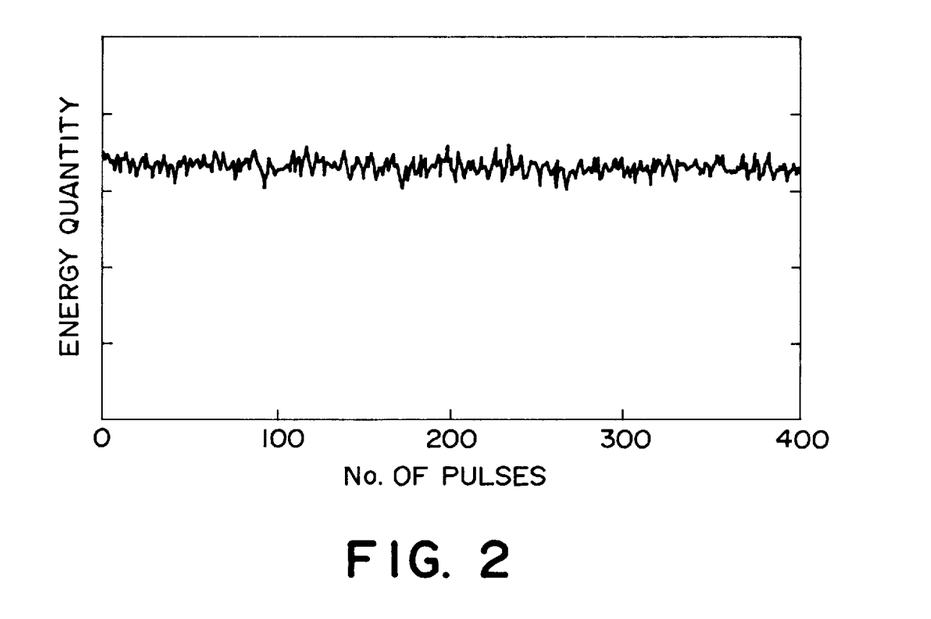
FIG. 2 is a graph for explaining an example of energy output in a case where a constant energy quantity is provided in accordance with an energy quantity control method of the present invention.

Equation (5) represents an inverse dynamic characteristic to the dynamic characteristic of the pulse energy producing source 1 as expressed by equation (4). Thus, if one-sample delay from detection to operation is permitted, the characteristic from w to p is whitened and the dynamic characteristic of the pulse energy producing source 1 in question can be apparently removed as illustrated in FIG. 2. Namely, the whitening compensation means 12 is provided with a characteristic corresponding to equation (5).

The integration compensating means 13 and the energy quantity integrating means 14 each involves integrating characteristic, and they are expressed in terms of transfer function of a discrete time system, wherein z is a time shift operator.

The integration compensating means 13 functions to compensate steady characteristic. That is, a difference between a subsequent target value as determined by the energy quantity determining means 16 and an actually measured value of current (or latest) energy quantity is integrated by the integration compensating means, and applied electric voltage is so controlled that the integrated value becomes constant. By this, the above-described long-term decrease of energy quantity (degradation of gas or temperature drift) can be avoided.

Figure 3:
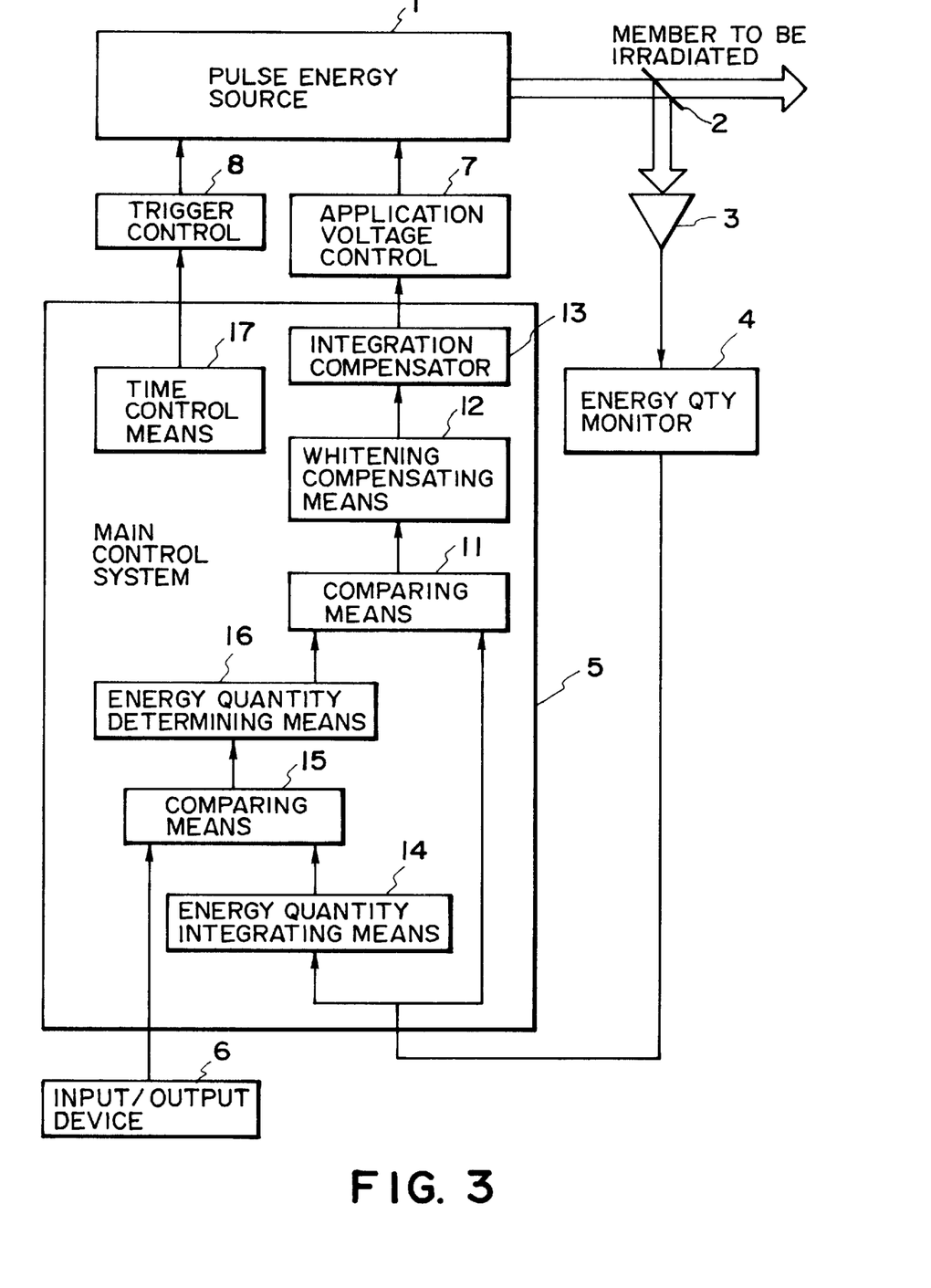
FIG. 3 is a block diagram for explaining a general structure of an energy quantity control system according to the present invention.

FIG. 3 illustrates a general structure of an energy quantity control system to which an energy quantity control method of the present invention is applied. Here, a most basic and simple structure is selected, and an energy pulse is emitted from a pulse energy producing source 1 in accordance with a predetermined emission condition as specified by an input/output device 6 into a main control system 5, and it is projected to an object to be irradiated. Like numerals as of those of FIG. 1 are assigned to elements having corresponding functions.

In FIG. 3, an applied voltage controller 7 controls a high-voltage discharging electric voltage source (corresponding to applied, electric voltage) of the pulse energy producing source 1. It supplies to the pulse energy producing source 1 an applied electric voltage which corresponds to an energy quantity of a subsequent energy pulse to be emitted subsequently, by which it adjusts the energy quantity of each energy pulse. Trigger controller 8 controls the emission (pulse number and emission interval, for example) by applying, after elapse of a predetermined charging time as required by the pulse energy producing source 1, an external trigger pulse to the pulse energy producing source 1 in response to a signal supplied thereto from time control means 17. Here, the trigger controller 8 and the applied voltage controller 7 each is operable in response to an instruction signal from the main control system 5.

It should be noted here that the pulse energy emitted by the pulse energy producing source 1 may comprise pulse energy of coherent laser light, incoherent pulse light or an electron beam other than light, for example.

The energy pulse emitted by the pulse energy producing source 1 is divided by a beam splitter 2. Most of the energy pulse passes it and illuminates the object to be irradiated. A portion of the pulse energy as reflected by the beam splitter 2 impinges on an energy monitoring device 3, which may comprises a pyroelectric power meter or a PIN photodiode, for example, in a case an excimer laser is used. The energy monitoring device 3 produces an accurate signal corresponding to the energy quantity and applies it to an energy monitoring means 4. The energy monitoring means 4 serves to transform each signal from the energy monitoring device 3 corresponding to a pulse, into an energy quantity. Namely, the energy monitoring device 3 and the energy quantity monitoring means cooperate to measure the energy quantity of pulse energy as definitely determined by optical performance of the beam splitter 2.

An actually measured value obtained by measurement through the energy quantity monitoring means 4 (it may be any value corresponding to the energy quantity as actually measured, and thus it may not be the energy quantity itself) is applied to the main control system 5. Basic features of the present invention reside in the internal structure of this main control system 3, and those for signal flow other than this are omitted here.

To the main control system 5, two signals, that is, a target value for integrated energy quantity as specified by the input/output device 6 as well as an actually measured value obtained by measurement through the energy quantity monitoring means 4 described above, are inputted. The energy quantity is integrated by the energy quantity integrating means 14, whereby an integrated energy quantity based on actually measured data is produced. The integrated energy quantity is compared with the target value therefor by the comparing means 15, by which a difference between those signals is detected. On the basis of this differential quantity, the energy quantity determining means 16 determines a target value for energy quantity of subsequent one pulse to be emitted subsequently.

The procedure of determining energy quantity as performed by the energy quantity determining means 16 may generally be done in accordance with what is called a PID operation using all factors of proportional-plus-integral-plus-derivative action or a portion of it. If necessary, a saturation operational element for limiting the operational range may be added to the energy quantity determining means 16. Also, in cases where the variable range of applied electric voltage to be applied to the pulse energy producing source 1 is small, it is preferable that each energy pulse reaches the target value for integrated energy quantity, with an almost constant energy, and that, to this end, the energy quantity determining means 16 may desirably determine the energy quantity by dividing the differential quantity by the number of remaining pulses for attaining the target value for integrated energy quantity.

The target value for energy quantity of subsequent one pulse to be emitted subsequently, as determined by the energy quantity determining means 16, is compared with an actually measured value of energy quantity by the comparing means 11, whereby a differential quantity is determined. This differential quantity is supplied through the whitening compensation means 12 and the integration compensating means 13 to the applied electric voltage control means 7.

The whitening compensation means 12 is called as a lead-lug element in terms of transfer function expression in the field of control engineering, and it is a standard compensation operating element. Also, as regards the integration compensating means 13, it is sufficient that it has at least one integrating characteristic. It may comprise a PID operational element.

The value for applied electric voltage thus determined is outputted from the main control system 5, together with the triggering operation for controlling the pulse interval. As a result of it, the pulse energy producing source 1 can emit a pulse energy of correct energy quantity with respect to the target value.

While in this embodiment the components of the main control system 5 are described as hardware elements, they may be provided by software functions.

Next, an embodiment of exposure apparatus to which an energy quantity control method of the present invention is applied, will be explained.

Figure 4:
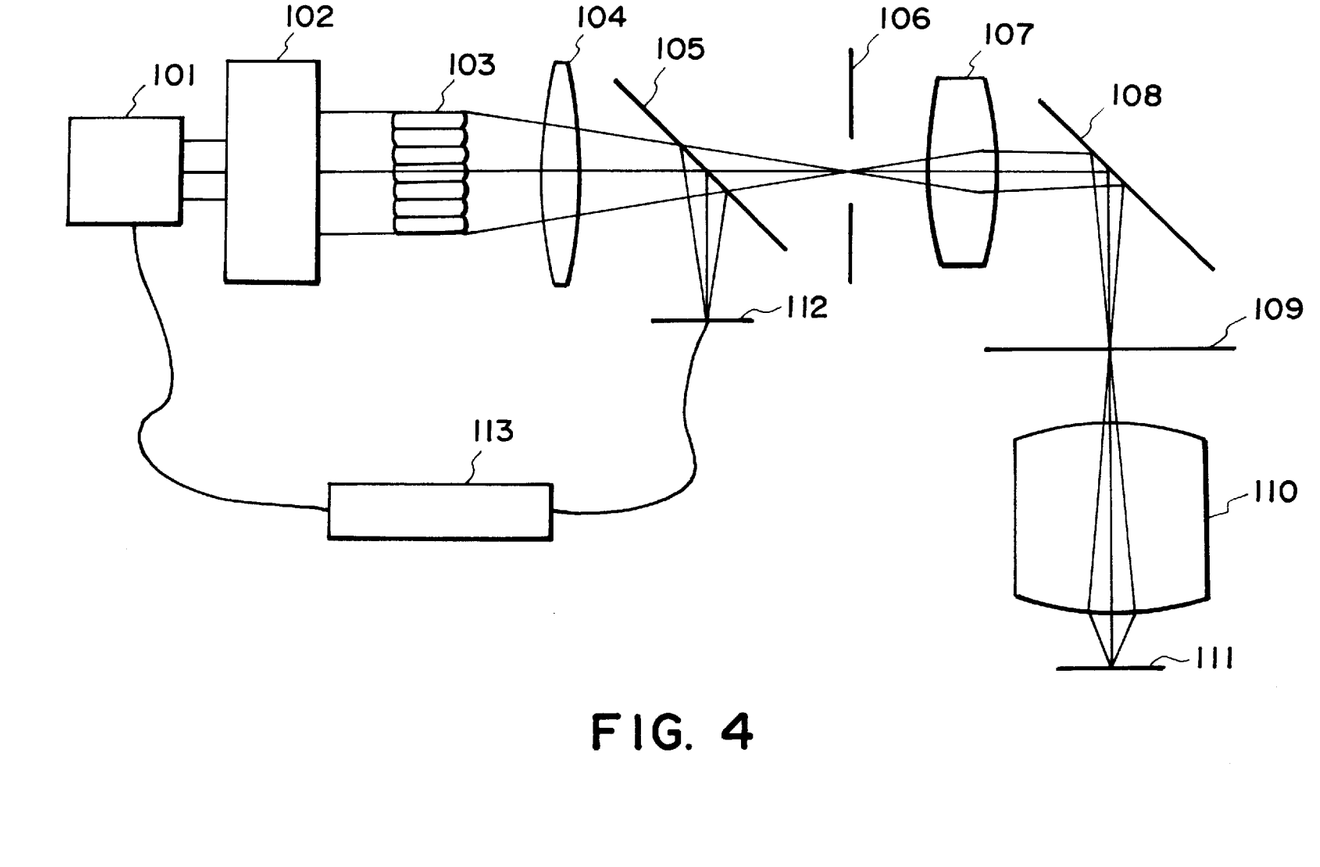
FIG. 4 is a schematic view of an exposure apparatus which uses an energy quantity control method and system according to the present invention.

FIG. 4 shows an exposure apparatus for use in manufacture of microdevices such as semiconductor devices (e.g., ICs or LSIs), liquid crystal devices, image pickup devices (e.g., CCDs) or magnetic heads, for example.

Light beam emitted from a light source 101 (pulse energy producing source in FIG. 3) such as an excimer laser, for example, is rectified by a beam shaping optical system 102 into a desired shape, and it is directed to a light entrance surface of an optical integrator 103 which may comprise a fly's-eye lens, for example. The fly's eye lens comprises a combination of a number of small lenses, and it serves to define secondary light sources in the vicinity of its light exit surface. Condenser lens 104 serves to illuminate (Kohler illumination) a masking blade 106 with lights from the secondary light sources of the optical integrator 103. A portion of pulse light divided by a half mirror 105 (beam splitter 2 of FIG. 3) is directed to a light quantity detector 112 (energy monitoring device 3 and energy monitoring means 4 of FIG. 3). The masking blade 106 and a reticle 109 are disposed in an optically conjugate relation with each other, with respect to an imaging lens 107 and a mirror 108, such that the shape of an opening of the masking blade 106 determines the shape and size of illumination region upon the reticle 109. Denoted at 110 is a projection optical system for projecting a circuit pattern, formed on the reticle 109, on to a wafer 111 in a reduced scale.

Denoted at 113 is a laser control system (main control system 5, trigger controller 8 and applied voltage controller 7 of FIG. 3) which serves to produce a trigger signal and an applied electric voltage signal corresponding to a desired exposure amount, and to apply them to the light source 10, by which the laser output and emission interval are controlled.

When the energy control method of the present invention is applied to an exposure apparatus, as described, high speed and high precision energy quantity control (exposure amount control) is assured, and improvement of throughput is enabled.

While in this embodiment the invention has been described with reference to a projection type exposure apparatus wherein a pattern of a reticle is projected through a projection optical system, the invention is applicable also to any other exposure apparatus of contact type, proximity type or slit scan type, for example, having a pulse energy producing source such as an excimer laser, for example, as a light source.

Next, an embodiment of semiconductor device manufacturing method using an exposure apparatus as described above, will be explained.

Figure 5:
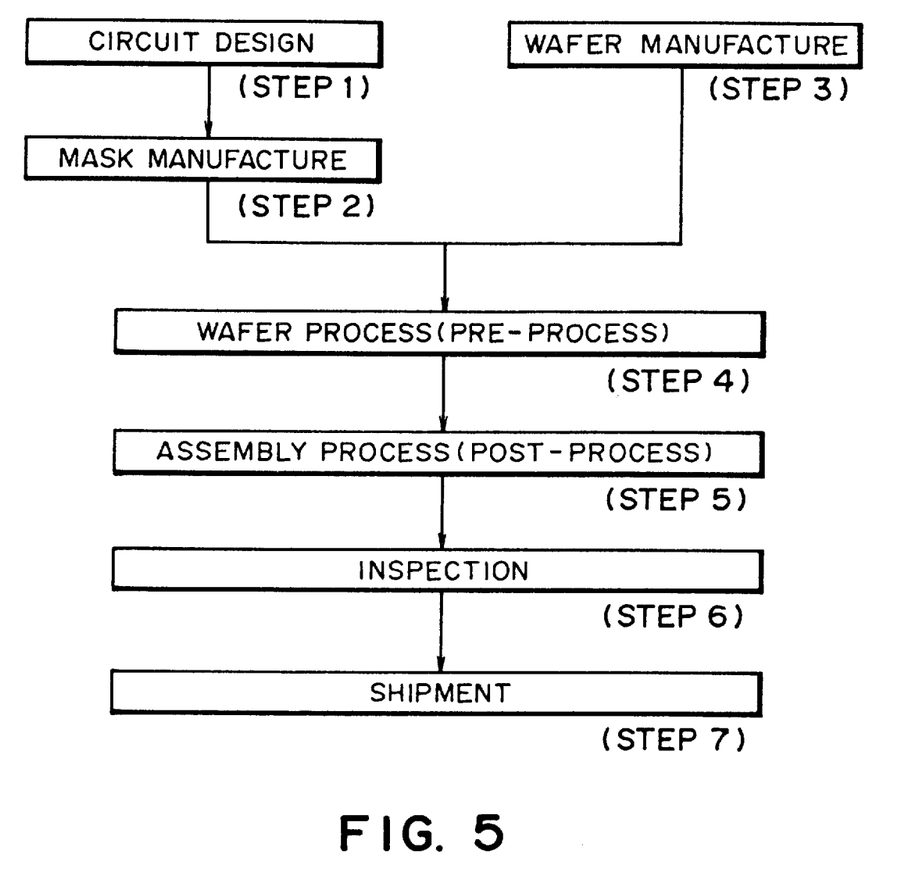
FIG. 5 is a flow chart for explaining semiconductor device manufacturing processes.

FIG. 5 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask (reticle 109) on the basis of the circuit pattern design. Step 3 is a process for manufacturing a wafer (wafer 111) by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 6:
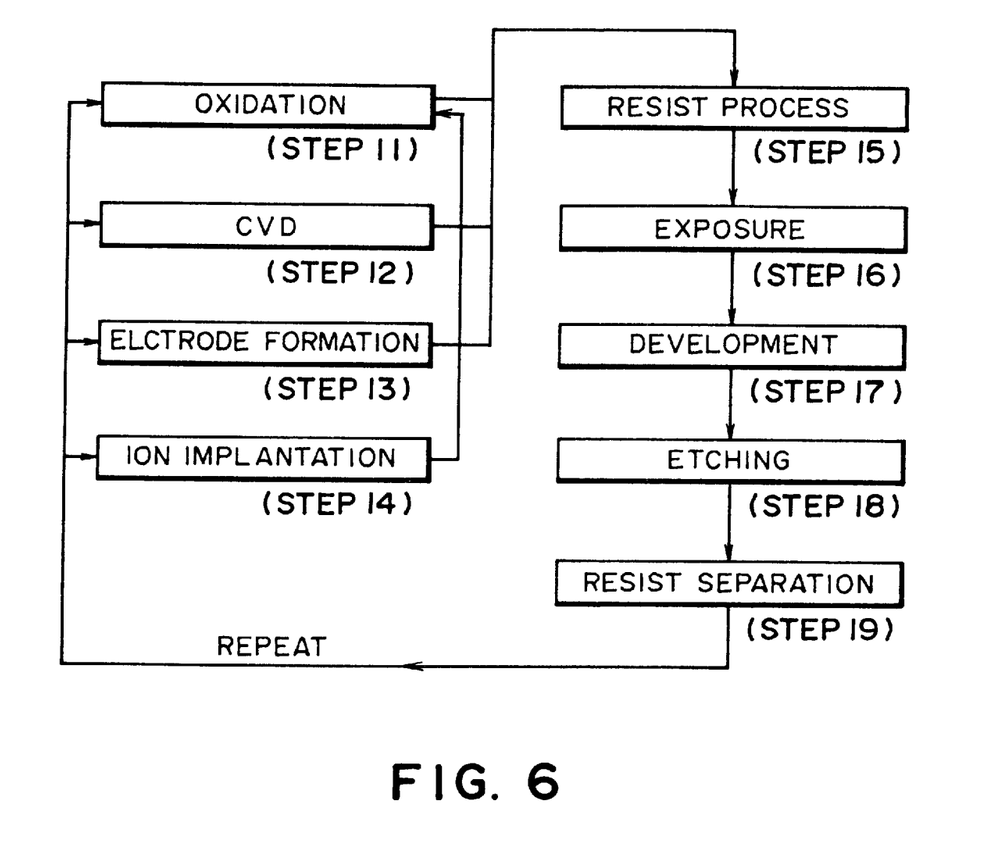
FIG. 6 is a flow chart for explaining details of a wafer process which is one of the processes of FIG. 5.

FIG. 6 is a flow chart showing details of the wafer process. Step 11 is an oxidation process for oxidizing the surface of a wafer (wafer 111). Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask (reticle 109) on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With the device manufacturing method of this embodiment, manufacture of high-precision semiconductor devices is facilitated.

While the invention has been described with reference to the structures disclosed herein, it is not confined to the details set forth and this application is intended to cover such modifications or changes as may come within the purposes of the improvements or the scope of the following claims.

What is claimed is:

1. An energy quantity control method usable with a pulse energy producing source for successively emitting energy pulses of an energy quantity variable with time, wherein a control parameter for the pulse energy producing source is adjustable to control an energy quantity of an energy pulse, said method comprising the steps of:

determining, on the basis of a difference between a desired value for integrated energy quantity of energy pulses and an actually measured value for the integrated energy quantity, a desired value for a subsequent energy quantity to be provided subsequently by a subsequent energy pulse; and adjusting the control parameter on the basis of a difference between the desired value for the subsequent energy quantity to be provided subsequently by the subsequent energy pulse and an actually measured energy quantity provided by a last-emitted energy pulse.

2. A method according to claim 1, wherein the control parameter is adjusted so as to reduce the difference between the desired value for the subsequent energy quantity to be provided subsequently by the subsequent energy pulse and the actually measured energy quantity provided by the last-emitted energy pulse.

3. A method according to claim 2, wherein, for every energy pulse emission, a value related to the difference between a desired value for a subsequent energy quantity to be provided subsequently by a subsequent energy pulse and an actually measured energy quantity provided by a last-emitted energy pulse is integrated, and wherein the control parameter is adjusted so that the integrated value becomes constant.

4. A method according to claim 1, wherein, for a characteristic of short-term energy quantity variation of the pulse energy producing source, an inverse characteristic is imparted to the control parameter, by which the characteristic of short-term energy quantity variation of the pulse energy producing source is compensated.

5. A method according to claim 4, wherein the short-term energy quantity variation of the pulse energy producing source comprises a spike-like energy quantity variation which appears just after start of energization of the pulse energy producing source.

6. A method according to claim 1, wherein the control parameter relates to one of an electric voltage to be applied to the pulse energy producing source and a charging electric voltage as the pulse energy producing source emits an energy pulse.

7. A method according to claim 1, wherein the pulse energy producing source comprises an excimer laser.

8. An energy quantity control system comprising:

a pulse energy producing source for successively emitting energy pulses of an energy quantity variable with time; and a controller controlling a parameter of said pulse energy producing source to control an energy quantity of an energy pulse by determining, based on a difference between a desired value for integrated energy quantity of energy pulses and an actually measured value for the integrated energy quantity, a desired value for a subsequent energy quantity to be provided subsequently by a subsequent energy pulse, and adjusting the control parameter based on a difference between the desired value for the subsequent energy quantity to be provided subsequently by the subsequent energy pulse and an actually measured energy quantity provided by a last-emitted energy pulse.

9. An exposure apparatus for transferring a pattern of a mask onto a wafer, said apparatus comprising:

a pulse energy producing source for successively emitting energy pulses of an energy quantity variable with time; and a controller controlling a parameter of said pulse energy producing source to control an energy quantity of an energy pulse by determining, based on a difference between a desired value for integrated energy quantity of energy pulses and an actually measured value for the integrated energy quantity, a desired value for a subsequent energy quantity to be provided subsequently by a subsequent energy pulse, and adjusting the control parameter based on a difference between the desired value for the subsequent energy quantity to be provided subsequently by the subsequent energy pulse and an actually measured energy quantity provided by a last-emitted energy pulse.

10. A device manufacturing method for manufacturing a semiconductor device comprising the steps of:

designing a circuit of the semiconductor device;

manufacturing a wafer using an exposure apparatus for transferring a pattern of a mask onto a wafer to manufacture the circuit designed in said designing step, said manufacturing step comprising:

determining, based on a difference between a desired value for an integrated energy quantity of energy pulses and an actually measured value for the integrated energy quantity, a desired value for a subsequent energy quantity to be provided subsequently by a subsequent energy pulse; and adjusting a control parameter based on a difference between the desired value for the subsequent energy quantity to be provided subsequently by the subsequent energy pulse and an actually measured energy quantity provided by a last-emitted energy pulse.

* * * * *

UNITED STATES PATENT AND TRADEMARK OFFICE
CERTIFICATE OF CORRECTION

PATENT NO. : 5,878,068

DATED : March 2, 1999

INVENTOR(S) : REIJI MITARAI, ET AL.

It is certified that error appears in the above-identified patent and that said Letters Patent is hereby corrected as shown below:

<u>COLUMN 5</u>,
Line 3, "comprises" should read --comprise--.

Signed and Sealed this

Seventh Day of September, 1999

Attest:

Q. TODD DICKINSON

*Attesting Officer*     *Acting Commissioner of Patents and Trademarks*